United States Patent [19]

Schmidt et al.

[11] 4,210,486
[45] Jul. 1, 1980

[54] PROCESS FOR DETERMINING THE EFFECTIVE DOPING AGENT CONTENT OF HYDROGEN FOR THE PRODUCTION OF SEMICONDUCTORS

[75] Inventors: Dietrich Schmidt, Burghausen; Johann Hofer, Kirchdorf; Heinz Herzer, Burghausen, all of Fed. Rep. of Germany

[73] Assignee: Wacker-Chemitronic Gesellschaft für Elektronik-Grundstobfa mbH, Burghausen, Fed. Rep. of Germany

[21] Appl. No.: 773,571

[22] Filed: Mar. 2, 1977

[30] Foreign Application Priority Data

May 25, 1976 [DE] Fed. Rep. of Germany ....... 2623350

[51] Int. Cl.$^2$ .............................................. B01J 17/34
[52] U.S. Cl. .................................... 156/601; 156/605; 73/23
[58] Field of Search .......... 156/605, 606, 620, 617 M, 156/601; 73/23

[56] References Cited

U.S. PATENT DOCUMENTS

| | | | |
|---|---|---|---|
| 3,097,069 | 7/1963 | Reuschel | 156/606 |
| 3,108,072 | 10/1963 | Gutsche | 156/606 |
| 3,108,073 | 10/1963 | Vanik | 156/606 |
| 3,141,848 | 7/1964 | Enk | 156/605 |
| 3,162,526 | 12/1964 | Vanik | 156/606 |
| 3,211,654 | 10/1965 | Jacob | 156/605 |
| 3,607,109 | 9/1971 | Capita | 156/606 |

FOREIGN PATENT DOCUMENTS 2415717 10/1975 Fed. Rep. of Germany ........... 156/605

OTHER PUBLICATIONS

Irvin, Bell System Tech. Journal, vol. 41, p. 387 and foll., 1962.
ASTM, Poly Silicon Evaluation, 2nd Draft, Mar. 1972, p. 7.

Primary Examiner—Hiram H. Bernstein
Attorney, Agent, or Firm—Allison C. Collard; Thomas M. Galgano

[57] ABSTRACT

A process for determining the effective doping agent content of hydrogen for the production of semiconductors which comprises zone drawing a silicon rod of highest purity and having a known specific resistance, in the presence of hydrogen to be tested, subsequently redetermining the specific resistance of the silicon rod, and computing the concentration of the doping agent in the hydrogen used from the known relationship between the specific resistance and the amount of doping agent. By stepwise determination of the resistance along the longitudinal axis of the rod, the amount of doping agent built into the rod at different levels can thus be determined.

1 Claim, 1 Drawing Figure

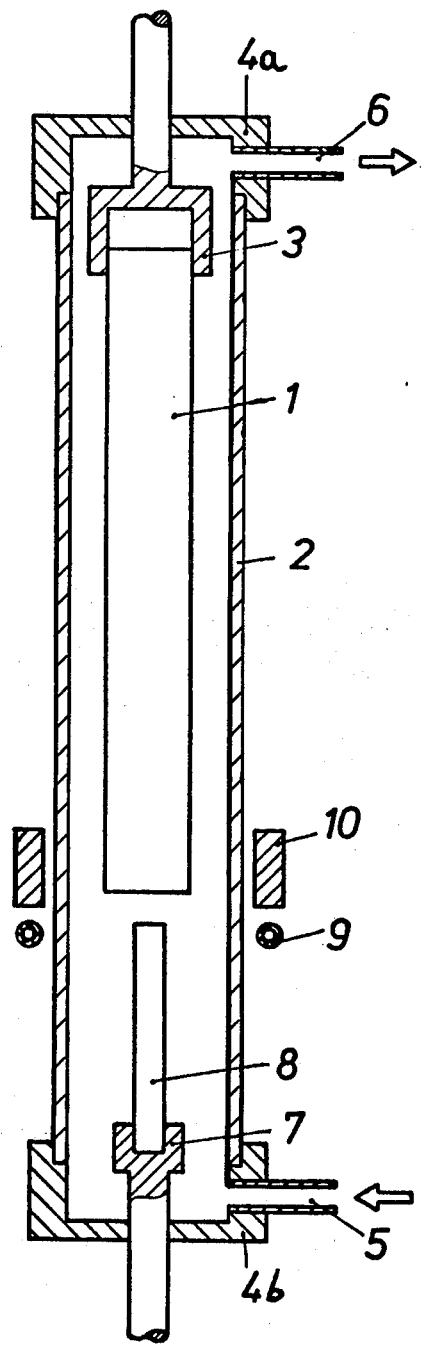

PROCESS FOR DETERMINING THE EFFECTIVE DOPING AGENT CONTENT OF HYDROGEN FOR THE PRODUCTION OF SEMICONDUCTORS

The invention relates to the determination of the effective doping agent content of hydrogen for the production of semiconductors.

The production of silicon for semiconductor materials, which conventionally starts with the decomposition of its volatile halogen compounds, e.g., trichlorosilane mixed with hydrogen, requires starting materials of highest purity. The reason is that impurities, such as boron, arsenic or phosphorus, have an undesired doping effect on the deposited silicon. Accurate methods for determining the doping content of the starting materials are therefore of highest significance.

According to a known process the effective doping agent content of hydrogen is determined by conveying hydrogen with trichlorosilane of known specification to a depositing plant and after deposition of silicon on thin rods at about 1100° C. is completed, measuring the specific resistance of the previously zone-drawn deposits. The specific resistance is a direct measure of the concentration of the built-in doping agent and hence also for the concentration of the effective doping activity of the hydrogen under examination.

The shortcoming of the known process consists of the dependence of the gaging value of the trichlorosilane, and most of all, in the time spent on the deposition of the silicon and the subsequent zone-drawing.

It is the object of the present invention to provide a process for determining the effective concentration of the doping agent in hydrogen for the production of semiconductors by which accurate measurements can be accomplished in a short time.

Other objects and advantages of the invention will become apparent from the following detailed description and the accompanying drawing.

According to the invention, a silicon rod of highest purity having a known specific resistance is zone-drawn in the presence of hydrogen to be tested, whereupon its specific resistance is again determined. By passing the hydrogen to be tested along the melting zone during the drawing process, doping agents which may be present in the hydrogen, are built into the silicon during its re-solidification. By measuring the specific resistance after re-solidification, the changed concentration of doping agent is determined which corresponds to the concentration of doping agent in the hydrogen which was used.

In the accompanying drawing, a device which is suitable for the determination is schematically illustrated by way of example, and the process of the invention will now be described with reference to the drawing.

In the drawing, there is shown a silicon rod of highest purity which was zone-drawn. The silicon rod has in the axial direction a known high specific resistance of advantageously, e.g., 4000 ohm/cm, p, or more, a length of about 50–200 cm, preferably 80–150 cm, and a diameter of 0.3–2 cm, preferably 0.6–1 cm. The rod is mounted in an apparatus known as "Keck-Device." The device comprises a quartz tube 2 which surrounds rod 1, the dimensions of the rod and the tube being so correlated that with the diameter of rod 1 being within the limits mentioned above, the distance between the rod and the wall of the tube will be about 0.1–0.2 cm. The rod is mounted in a holding member 3 which is rotatable about its vertical axis. The device is closed at the top by a metal or plastic cap 4a and at the bottom by a metal or plastic cap 4b, the former provided with a gas discharge 6, and the latter with a gas admission pipe 5. Air is expelled from the device by passing through hydrogen or an inert gas, e.g. argon, or by evacuation.

During the zone-drawing operation, the hydrogen to be tested is introduced through admission pipe 5 at a rate of preferably 100–600 cm/sec measured between rod and surrounding wall of tube 2. A seed crystal 8 is mounted for lifting or lowering in a holding member 7, which is likewise rotatable on its vertical axis. A single-turn induction heating coil 9 serves to melt both rod 1 and seed crystal 8 to be attached thereto. However, before the attachment takes place, the bottom end of rod 1 is heated up to a temperature of 500°–1400° C. by means of a heating ring 10 e.g. consisting of carbon and located above coil 9.

The attachment of the seed crystal to the silicon rod is then carried out in a known manner. Subsequently, rod 1 is gradually melted by moving coil 9 toward the top at a drawing rate of 0.01–1 cm/min., preferably 0.1–0.3 cm/min. and is thereafter resolidified. Rod 1 is then taken out of the device and the specific resistance is determined in individual steps along the longitudinal axis of the rod, in a manner known per se. From the findings, the amount of doping agent built in at different levels can be determined, and, with the rate of drawing known, the concentration of doping agent in the hydrogen at any given moment can be determined.

According to another modified process, the quality of the hydrogen to be tested with regard to its effective concentration of doping agent can be determined continuously, by moving metering electrodes so as to follow coil 9 at a distance of about 20–40 cm, the electrodes permitting high frequency resistance measurements to be made. In order to arrive at comparable data, it is necessary to have each measured level cooled to the same temperature of about 25° C. by the passing hydrogen.

As high frequency measuring methods, we may use the cross-flow method, two-point method, bridge method or, preferably the resonance circuit method as described in full detail by W. Keller, in the journal "Zeitschrift für angewandte Physik" 11, 346 ff. (1959) and in "Internationale Elektronik Rundschau" 28 (5) (1974).

The computation of the concentration of the doping agent from the specific resistance is made in a known manner, e.g., from the tables of D. J. Irvin in "Bell System Technical Journal," Vol. 41, p. 387 and foll., 1962. The computation back to the quantity of doping agent previous to zone drawing may be made with the aid of ASTM, Poly Silicon Evaluation, 2nd draft, March 1972, p. 7. As mentioned above, the process according to the invention does not require any trichlorosilane, and is therefore independent of the gaging value of trichlorosilane, consequently, it is more accurate. Furthermore, fluctuations of the quality of the hydrogen can be ascertained accurately for any time, because they may be rated for definite levels along the zone-drawn silicon rod.

The process of the invention will now be described more fully in an example, but it should be understood that this is given by way of illustration and not of limitation.

EXAMPLE

A zone-drawn silicon rod of 120 cm length and 0.8 cm diameter, having a uniform specific resistance of 5000 Ohm/cm, p in axial direction, is mounted in a "Keck-Device" as illustrated schematically in the drawing. The quartz tube has an inner diameter of 1 cm. After the bottom end of the rod has been heated to about 1100° C. by means of a carbon ring, a seed crystal is attached and a melt zone is made to form while the hydrogen to be tested is passing by from bottom to top in the space between the rod and the wall of the tube flowing at a rate of 150 cm/sec. corresponding to 150 l/h; the melt zone is made to pass through the entire length of the rod due to the vertical movement of single-turn induction heating coil at a drawing speed of 0.2 cm/min. The height of the melted zone is in this case 0.6 cm. After about 10 hours, the rod is taken out, and the specific resistance in the axial direction is determined in individual steps at every 2 cms. The value obtained is an even 80 ohm/cm. p, which leads to the conclusion that the hydrogen used has a uniform effective p-doping concentration of 0.25 ppb throughout the entire drawing process.

COMPUTATION

Each volume element is held in molten state for 3 minutes; in 3 minutes, 7.5 l hydrogen are passing the melted zone. The specific resistance drops from 5000 chm/cm, p corresponding to $2.8 \times 10^{12}$ atoms/cc, 80 ohm, p corresponding to $1.7 \times 10^{14}$ atoms/cc. Therefore, $1.7 \times 10^{14} - 2.8 \times 10^{12} = 1.67 \times 10^{14}$ atoms/cc have been added to the silicon rod as effective doping atoms.

The volume of the melted zone is 0.3 cc. consequently, in 7.5 l hydrogen $0.5 \times 10^{14}$ effective p-doting atoms are present, in a mol therefore $1.49 \times 10^{14}$. This corresponds to an effective doping agent concentration of 0.25 ppb.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for determining the purity of hydrogen used in the production of semiconductors, relative to the effective doping agent content thereof, comprising the steps of:

zone drawing a silicon rod of highest purity and known specific resistance in a quartz tube havng a slightly larger internal diameter than the diameter of the silicon rod by means of an induction coil surrounding said quartz tube, moving at a speed of 0.01 to 1 cm/min., solely in the presence of the hydrogen to be tested by passing a definite amount of said hydrogen around said rod during the zone-drawing thereof and thereby doping said silicon rod with the doping agents which may be present in said hydrogen; and determining the effective doping agent content of said hydrogen and, in turn, the purity thereof, by measuring the specific resistance of the silicon rod after zone-drawing.

UNITED STATES PATENT AND TRADEMARK OFFICE
CERTIFICATE OF CORRECTION

PATENT NO. : 4,210,486
DATED : JULY 1, 1980
INVENTOR(S) : SCHMIDT ET AL

It is certified that error appears in the above—identified patent and that said Letters Patent is hereby corrected as shown below:

Cover page, Identification of the Assignee, change "Wacher-Chemitronic Gesellschaft fur Elektronik-Grundstobfa mbH" to --Wacker-Chemitronic Gesellschaft fur Elektronik-Grundstoffe mbH--.

Signed and Sealed this

Thirtieth Day of September 1980

[SEAL]

Attest:

SIDNEY A. DIAMOND

Attesting Officer

Commissioner of Patents and Trademarks